United States Patent [19]
Ushikawa

[11] Patent Number: 5,310,339
[45] Date of Patent: May 10, 1994

[54] HEAT TREATMENT APPARATUS HAVING A WAFER BOAT

[75] Inventor: Harunori Ushikawa, Kofu, Japan

[73] Assignee: Tokyo Electron Limited, Tokyo, Japan

[21] Appl. No.: 51,443

[22] Filed: Apr. 23, 1993

Related U.S. Application Data

[63] Continuation-in-part of Ser. No. 765,888, Sep. 26, 1991, abandoned.

[30] Foreign Application Priority Data

Sep. 26, 1990 [JP] Japan .................. 2-256155

[51] Int. Cl.⁵ .................................. F27D 5/00
[52] U.S. Cl. .................. 432/253; 432/258; 432/259
[58] Field of Search .......... 432/241, 5, 6, 253, 432/258, 259

[56] References Cited

U.S. PATENT DOCUMENTS

| | | | |
|---|---|---|---|
| 2,208,734 | 7/1940 | Schreiber | 432/259 |
| 3,948,594 | 4/1976 | Irwin, Jr. | 432/259 |
| 4,468,259 | 8/1984 | Mimura . | |
| 4,504,224 | 3/1985 | Hewitt | 432/258 |
| 4,636,170 | 1/1987 | Stupka | 432/258 |
| 4,735,220 | 4/1988 | Chandler . | |
| 4,938,691 | 7/1990 | Ohkase et al. | 432/253 |
| 5,131,842 | 7/1992 | Miyazaki et al. | 432/253 |

FOREIGN PATENT DOCUMENTS

| | | |
|---|---|---|
| 56-50199 | 5/1981 | Japan . |
| 58-108735 | 6/1983 | Japan . |
| 58-175826 | 10/1983 | Japan . |
| 59-3935 | 1/1984 | Japan . |
| 60-124031 | 8/1985 | Japan . |
| 61-201695 | 9/1986 | Japan . |
| 61-247048 | 11/1986 | Japan . |
| 62-22526 | 5/1987 | Japan . |
| 2223470 | 4/1990 | United Kingdom . |

*Primary Examiner*—Henry C. Yuen
*Attorney, Agent, or Firm*—Oblon, Spivak, McClelland, Maier & Neustadt

[57] ABSTRACT

A heat treatment apparatus for transferring a semiconductor wafer between a cassette and a boat and heat-treating a number of wafers loaded on the boat, comprising wafer holding assembly for supporting the wafer, and a plurality of posts for supporting the wafer holding assembly at predetermined intervals. The wafer holding assembly includes a ring member having an outside diameter larger than the diameter of the wafer and supported at a part of a peripheral portion thereof by the posts, and a plurality of supporting pieces provided onto the ring member, for supporting the wafer directly in contact with the wafer.

17 Claims, 11 Drawing Sheets

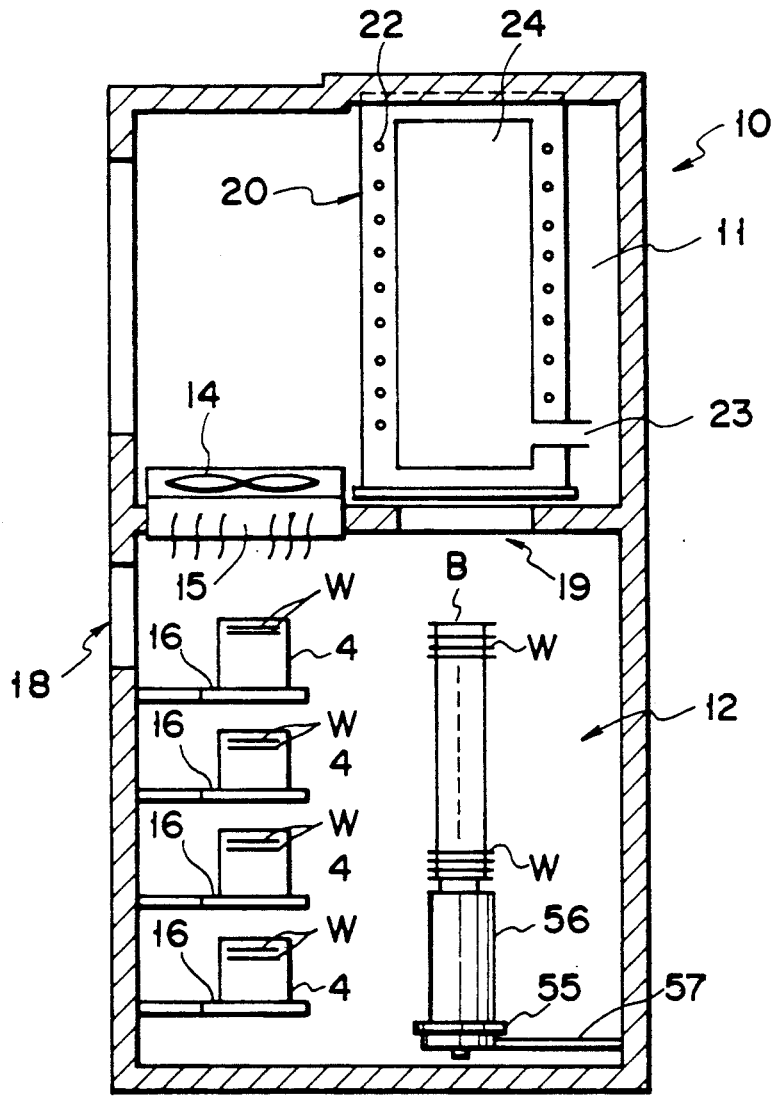
F I G. 1

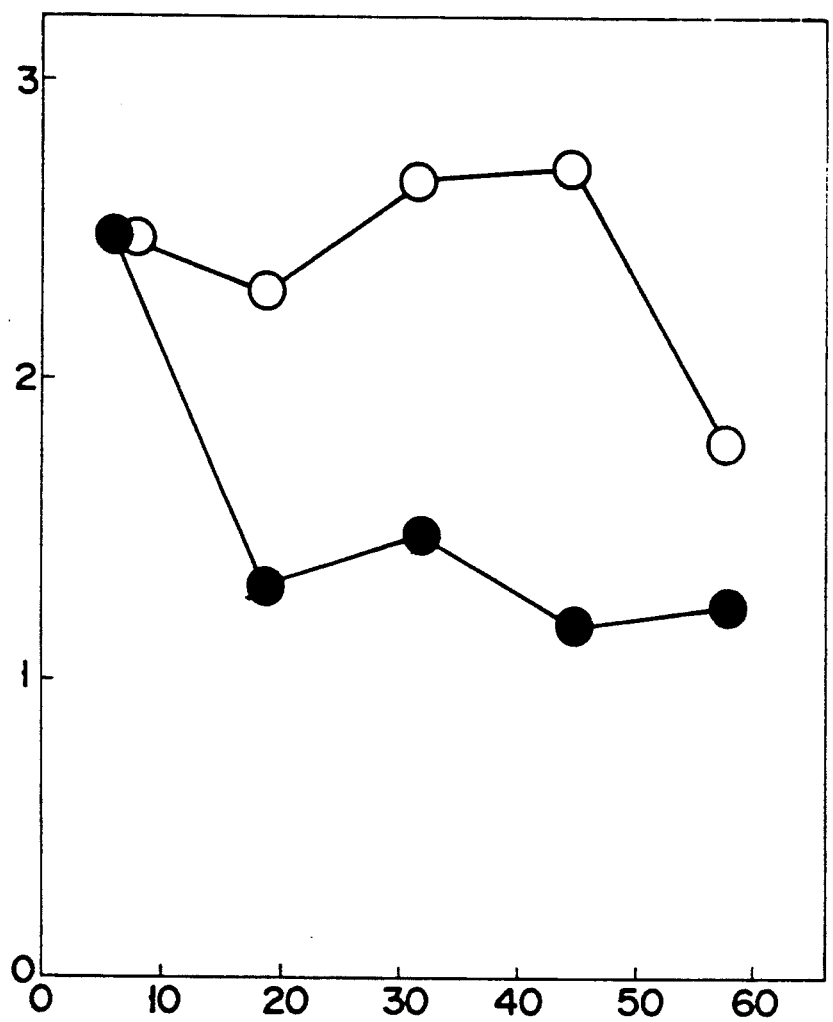
F I G. 12

HEAT TREATMENT APPARATUS HAVING A WAFER BOAT

This application is a continuation-in-part of application Ser. No. 07/765,888, filed on Sep. 26, 1991, now abandoned.

BACKGROUND OF THE INVENTION

1. Field of the Invention

The present invention relates to a heat treatment apparatus having a wafer boat for heat-treating a semiconductor wafer, and more particularly, to an improvement of a boat for heat treatment adapted to be loaded in a vertical furnace.

2. Description of the Related Art

Since a vertical CVD apparatus is designed so that a wafer boat can be taken into or out from a process tube without touching the inner wall of the tube, it advantage, the apparatus of this type is conventionally used for the manufacture of a large scale integration semiconductor device, such as a VLSI.

In order to form a thin film with a uniform thickness on a large number of semiconductor wafers at a time, in a vertical furnace, a uniform flow of process gas must be produced with a minimum disturbance in the process tube.

In the vertical CVD furnace, in contrast with this, batch processing is executed, so that as many wafers as possible are expected to be processed at one time. Therefore, various components (supporting members and reinforcing members) of the wafer boat arrest a uniform gas flow in the process tube. Conventionally, there has been an attempt to improve the uniformity of wafer-surface film thickness during the film forming operation by variously changing the shape of the wafer boat.

Disclosed in Published Unexamined Japanese Patent Applications Nos. 58-108735 and 61-201695 is a wafer boat having a wafer loading disk whose diameter is larger than the wafer diameter. With use of this wafer boat, the deviation of wafer-surface film thickness can be decreased when phosphine ($PH_3$) is added while a polysilicon film is being formed, and the film is finally doped with phosphorus to form a phosphorus-doped polysilicon film.

In a VLSI having a memory capacity of 1 to 4 megabits, however, the circuit pattern is so fine that it requires a high uniformity of wafer-surface film thickness. The aforesaid wafer boat cannot, however, fulfill this requirement. The larger the wafer diameter, in particular, the less uniform the film thickness at the peripheral edge portion of the wafer is liable to be. Modern wafers tend to switch from 6-inch versions to 8-inch versions, requiring effective measures to ensure the uniformity of wafer-surface film thickness.

SUMMARY OF THE INVENTION

The object of the present invention is to provide a heat treatment apparatus having a wafer boat, in which the deviation of the wafer-surface thickness of a film formed on a semiconductor wafer can be decreased.

According to an aspect of the present invention, there is provided a heat treatment apparatus for transferring a semiconductor wafer between a cassette and a heat-resistant boat and for heat-treating a number of wafers loaded on the boat, comprising: the boat having a wafer holding assembly for holding the wafer, a plurality of main posts, and a plurality of tongues equidistantly mounted to said main posts and projecting inward of the main posts; said wafer holding assembly having a ring member fixed to said tongues and a plurality of supporting pieces mounted on an upper surface of said ring member such that wafers are brought into direct contact with said supporting pieces, an outer diameter of said ring member being larger than the wafer diameter; and a clearance being formed between the wafer supported by the supporting piece and the ring member such that a process gas passes through said clearance to flow in a vertical direction within the boat so as to be supplied onto an upper surface of the wafer.

In the wafer boat constructed in this manner, the influences of the posts on the filming process can be reduced, and a process gas flow around the wafer can be adjusted by means of the holding assembly, whereby the uniformity of wafer-surface film thickness can be higher than in the conventional case. The supporting pieces must be at least three in number.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a vertical sectional view showing an outline of a vertical CVD apparatus;

FIG. 12 is a graph illustrating the uniformity of film thickness obtained with use of the boat according to the present invention compared with that obtained with use of a conventional boat;

DETAILED DESCRIPTION OF THE PREFERRED EMBODIMENTS

Figure 2:
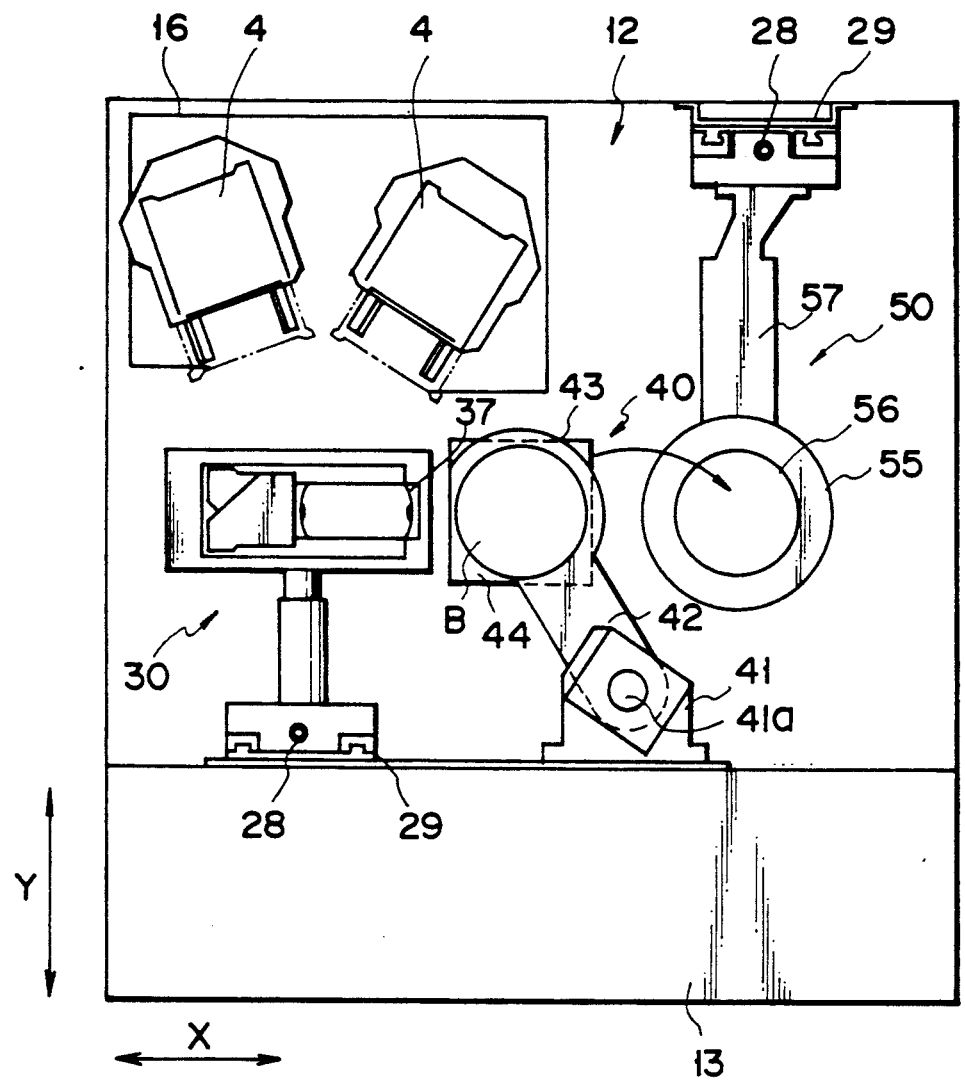
FIG. 2 is a top plan view showing a wafer transfer section of the CVD apparatus.

Various embodiments of the present invention will now be described in detail with reference to the accompanying drawings.

As shown in FIG. 1, a vertical CVD apparatus 10 comprises a process section 11 and a wafer transfer section 12. The sections 11 and 12 are arranged at upper and lower portions of the apparatus 10, respectively. A fan 14 having a filter 15 is disposed between the sections 11 and 12. The fan 14, which is located right over a cassette station 16 in the wafer transfer section 12, serves to supply clean air to the station 16 during the transfer of a semiconductor wafer W.

A carrier port (not shown) is formed in the front of the wafer transfer section 12. A plurality of cassettes 4 are introduced into the CVD apparatus 10 through the carrier port. Each cassette 4 can contain twenty-five 8-inch wafers W at the most. The wafer transfer section 12 and the carrier port communicate with each other by means of an opening 18.

A vertical furnace 20 is disposed in the process section 11. The furnace 20 includes a process tube 24 which is surrounded by a coil heater 22. The tube 24, which is made of quartz, is closed at the top and open at the bottom. The bottom opening of the process tube 24 communicates with the wafer transfer section 12 through an opening 19. The coil heater 22 is composed of at least three zones to form an uniformity of temperature in tube 24. Thus divided, the heater 22 can produce a temperature gradient within a desired range in the process tube 24. The heater 22 and its control system are arranged so that a temperature gradient can be produced such that the temperature of the process tube 24 increases from its top portion toward its bottom portion, within a range of, for example, 500° to 1,000° C.

A lid member 55 of a boat loading-unloading mechanism 50 is located directly under the bottom opening of the process tube 24. A heat insulating cylinder 56 is mounted on the lid member 55, and a boat B is placed on the cylinder 56.

Figure 3:
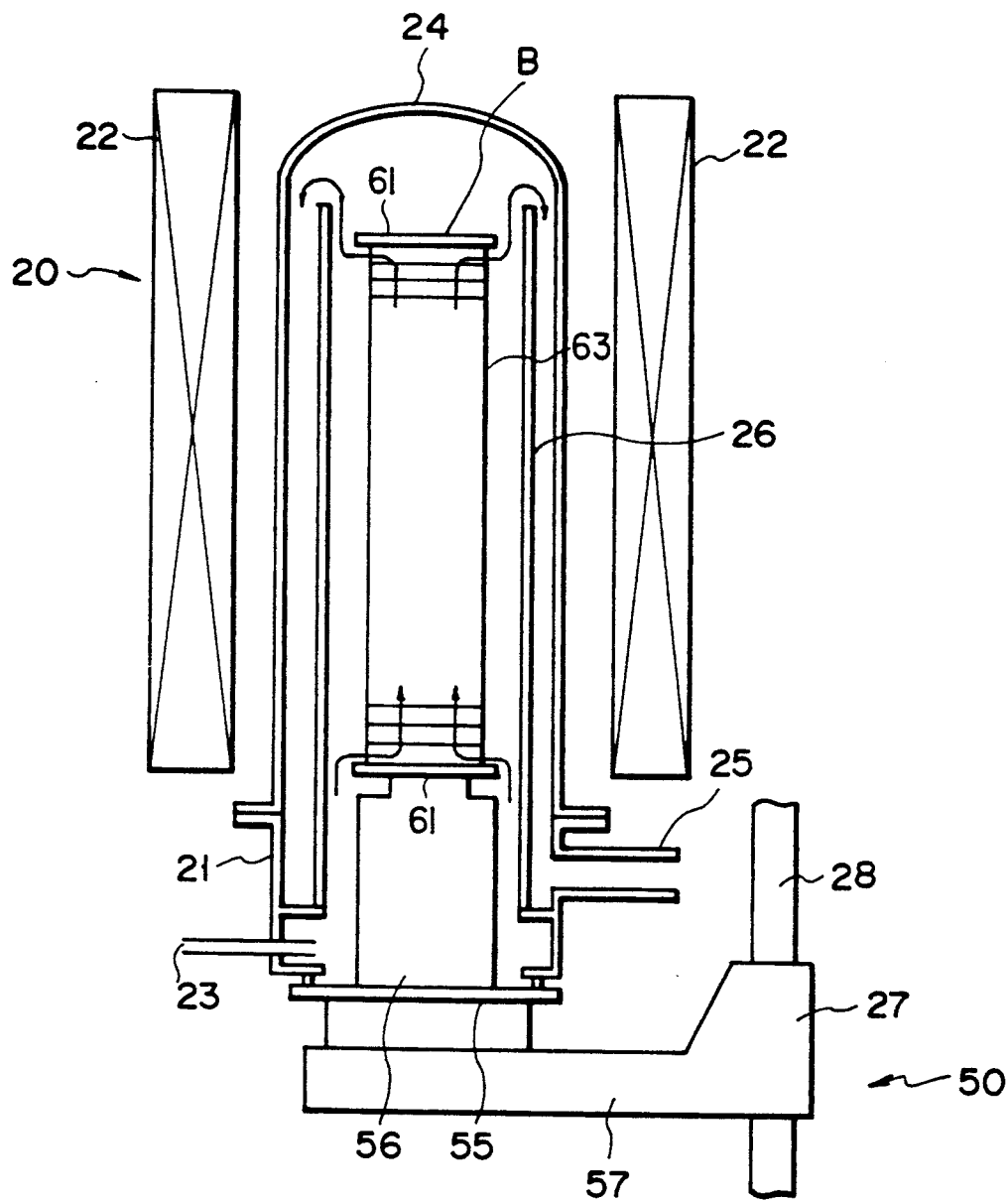
FIG. 3 is a vertical sectional view showing a wafer boat loaded in a furnace of the CVD apparatus.

As shown in FIGS. 2 and 3, the lid member 55 is supported by means of a supporting member 57 of a robot, whose nut 2 is screwed on a ball screw 28. The screw 28 extends vertically (in the Z-axis direction) along a linear guide 29. Each of the drive mechanism is automatically controlled by means of a predetermined program. The inner region of the process tube 24 is partitioned by an inner cylinder 26. A manifold 21 is attached to the lower portion of the tube 24. It is provided with an inlet 23 and an outlet 25 through which gas is introduced or discharged. The inner region of the process tube 24 communicates with a plurality of sources of process gas supply (not shown) by means of the inlet 23. The outer region of the tube 24 communicates with an exhaust system (not shown) by means of the outlet 25. With this arrangement, a specific decompressed atmosphere is set in the process tube 24 so that a process gas flow is formed parallel to the surface of the wafer W.

Figure 4:
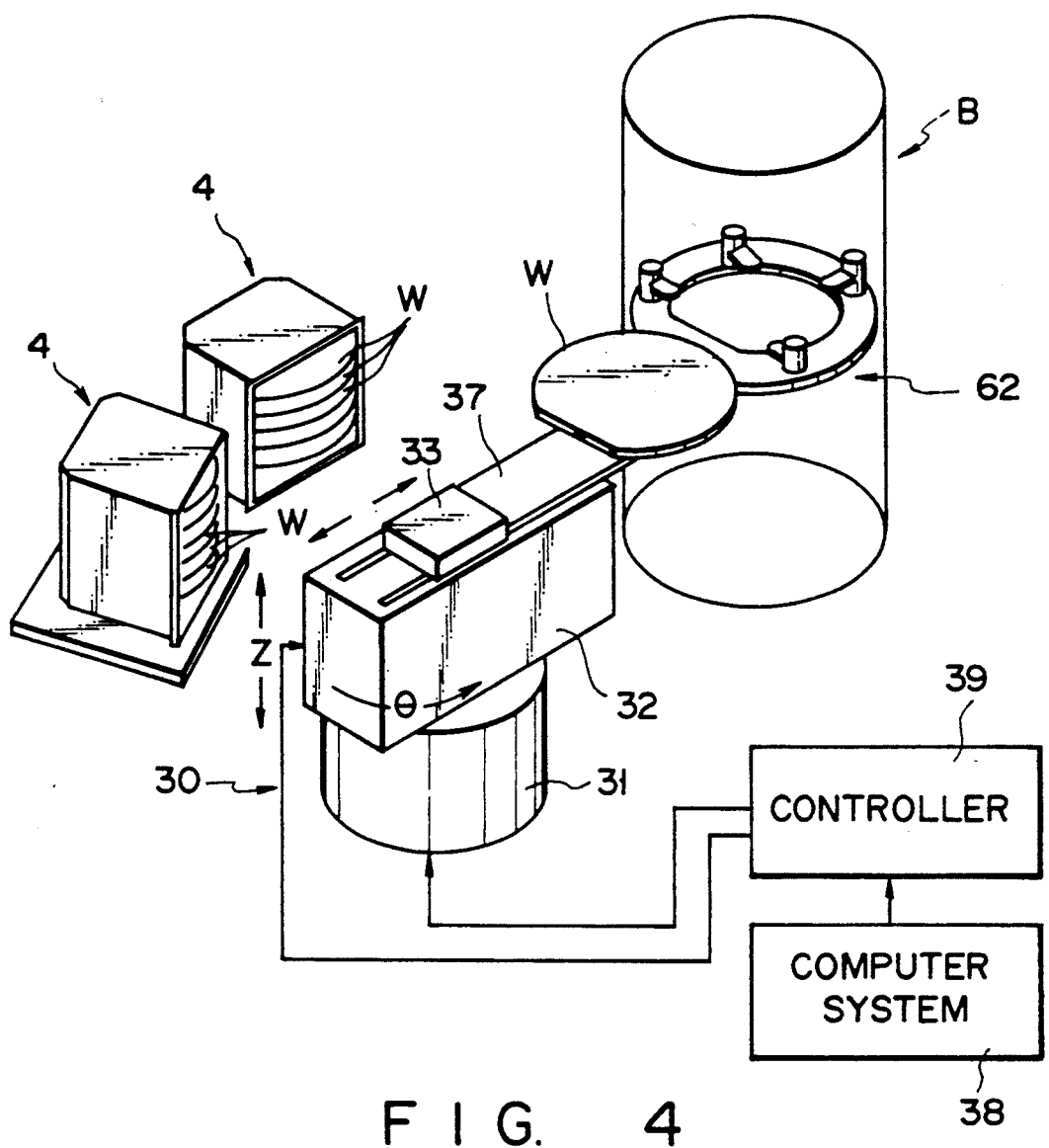
FIG. 4 is a perspective view showing a wafer transfer apparatus for transferring wafers from a cassette to the boat.

As shown in FIGS. 2 and 4, a transfer device 30 is provided at that portion of the wafer transfer section 12 which faces the cassette station 16. The device 30 includes a fork 37 for loading and unloading the wafers W. The fork 37 is connected to a slider 33, which is mounted on a drive mechanism 32. The drive mechanism 32 is mounted on a turning mechanism 31.

The whole transfer device 30 is moved up and down in the Z-axis direction by means of the ball screw 28, the linear guide 29, and a drive motor (not shown). The lift mechanism, turning mechanism, and arm drive mechanism of the transfer device 30 are automatically controlled by means of a controller 39, which is backed up by a computer system 38.

As shown in FIG. 2, a boat transportation mechanism 40 is disposed between the wafer transfer device 30 and the boat loading-unloading mechanism 50. A gear box 41 of the transportation mechanism 40 is fixed to a housing 13, and a robot arm 42 is swingable around a shaft 41a in the box 41. An arcuate holder 43 is formed at the distal end of the arm 42, and a boat B on a stage 44 is held by means of the holder 43.

Figure 5:
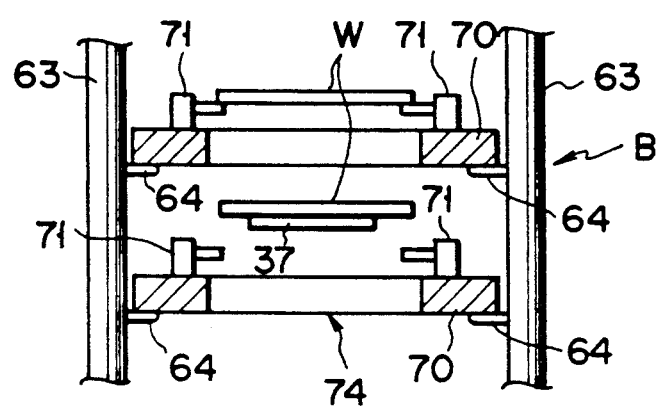
FIG. 5 is a partial front view showing part of the boat receiving the wafers being transferred.
Figure 6:
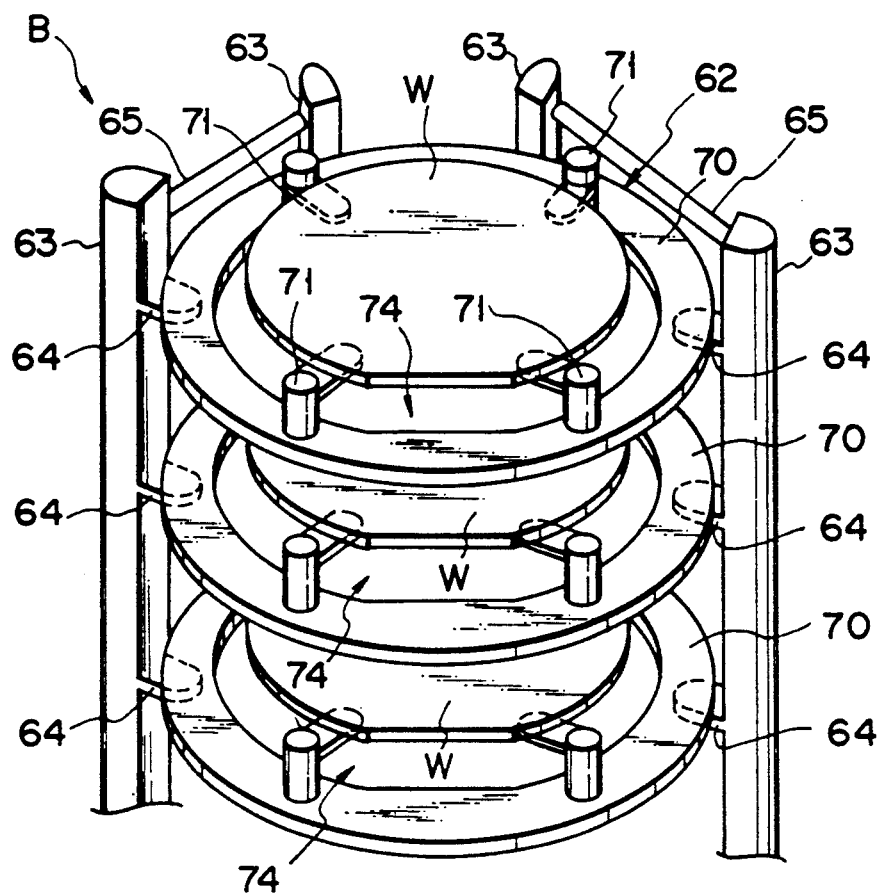
FIG. 6 is a partial perspective view showing part of the boat loaded with a large number of wafers.

As shown in FIGS. 5 and 6, the framework of the boat B is composed of four main posts 63 and several reinforcing ribs 65. The ribs 65 are stretched between the adjacent main posts 63, usually at two positions, upper and lower, or three positions, upper, middle, and lower. The upper and lower ends of each post 63 are fixed individually to end plates 61.

Supporting tongues 64 protrude inward from each main post 63. They are arranged at regular intervals on each post 63. A wafer holder 62 is supported by these four tongues 64.

Figure 7:
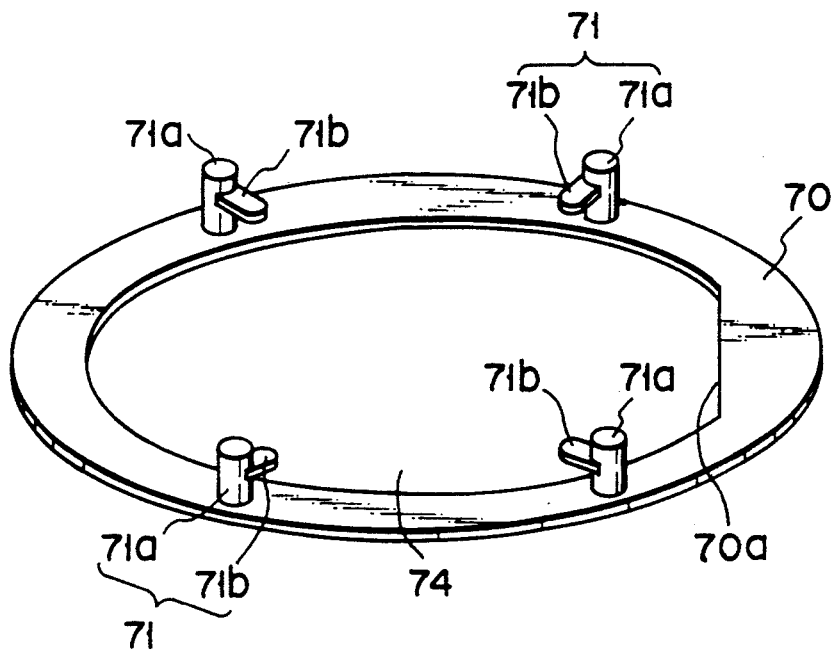
FIG. 7 is a perspective view showing a supporting member to be attached to the boat.

As shown in FIG. 7, the wafer holder 62 includes a ring member 70 and a plurality of wafer supporting pieces 71. The ring member 70 has a thickness of 2 mm, outside diameter of 170 mm, and inside diameter of 150 mm. A straight portion 70a is formed on the inner periphery of the ring member 70 so as to correspond to an orientation flat (O.F.) of the wafer W. In case of O.F's length of 55 mm, the shortest distance between the straight portion 70a and the center of the ring member 70 is 69 mm. The individual parts of the boat B are formed of a heat-resisting material, such as quartz or SiC.

Figure 10:
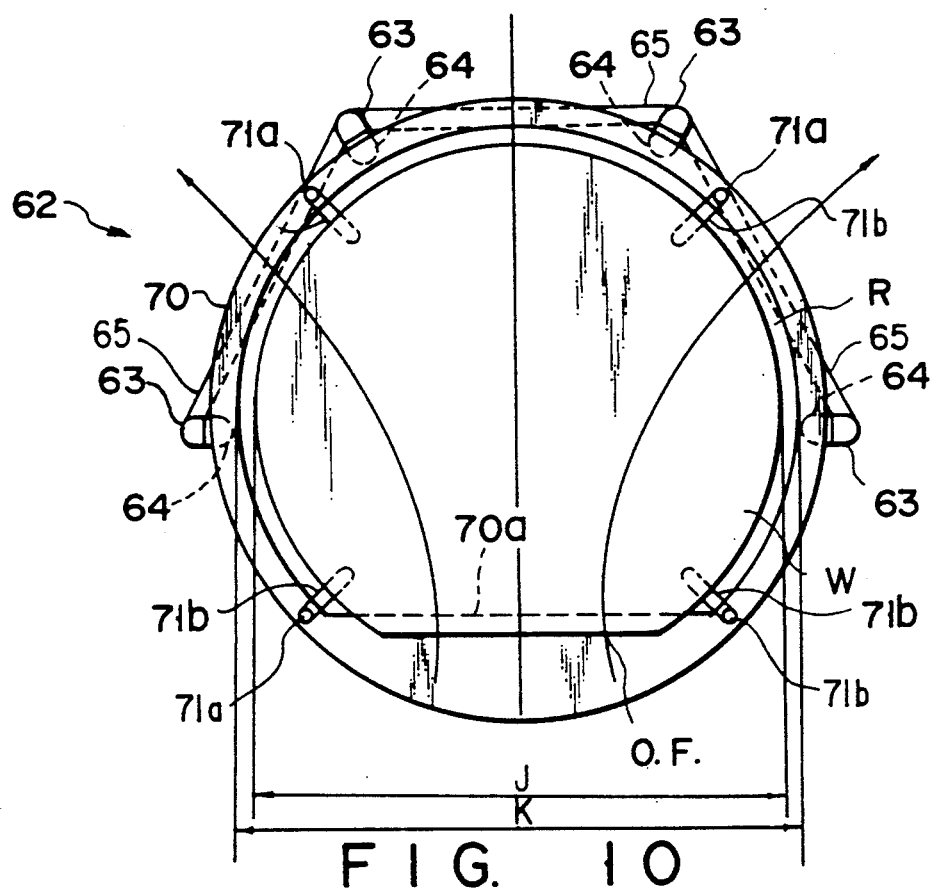
FIG. 10 is a top plan view showing a wafer loaded in the boat.

As shown in FIGS. 6 and 10, the intervals between the four main posts 63 around the axis of the boat are not equal. More specifically, the distance between the main posts 63 on the wafer loading side (side of O.F. and straight portion 70a) is longer than that between the other two.

As shown in FIG. 10, four main posts 63 are equidistantly arranged to form a semicircular configuration. The distance K between the two main posts at the ends of the semicircular configuration is larger than the diameter J of a wafer W. A reinforcing rib 65 is stretched between adjacent main posts 63, though the rib 65 is not stretched between the two main posts 63 at the end of the semicircular configuration noted above. Further, an end plate 61 is fixed to each of the upper and lower ends of the main post 63, as shown in FIG. 3.

The wafer W is put in and taken out of the boat B through the clearance between the two main posts 63 at the ends of the semicircular configuration of the main posts 63. The wafer W put in the boat B is disposed on a ring member such that the orientation flat O.F. of the wafer W is positioned on the front side of the boat B. The distance K shown in FIG. 10 is sufficiently large. In addition, obstructive members are not provided in the front region of the boat B. It follows that the process gas tends to flow from the front region toward the back region within the boat B as denoted by arrows. As apparent from the drawing, a sufficiently large amount of the process gas is supplied to the front region in the vicinity of the orientation flat O.F. It follows that the thickness of the film formed in the vicinity of the orientation flat O.F. of the wafer is made substantially equal to that of the film formed in the other region of the wafer.

The four wafer supporting pieces 71 are arranged on the upper surface of the ring member 70. Each supporting pieces 71 is a combination of a columnar member (short post) 71a and a plate member (supporting tongue) 71b. The short post 71a is set up on the upper surface of the ring member 70, while the supporting tongue 71b is mounted on the outer peripheral surface of the post 71a. The tongue 71b extends from the post 71a toward the center of the ring member 70. The distal end of the tongue 71b projects into an opening 74 of the ring member 70. The upper surface of the supporting tongue 71b is substantially horizontal. The post 71a and the tongue 71b ar assembled together by fitting.

In the present embodiment, as shown in the top view of FIG. 10, there is a narrow space R between the loaded wafer W and the ring member 70. The width of this space R is set within a range of Zero to 8 mm, preferably at 2 mm. At its orientation flat (O.F.) portion, however, the wafer W overlaps the straight portion 70a of the ring member 70 for a length of about 2 mm.

Figure 8:
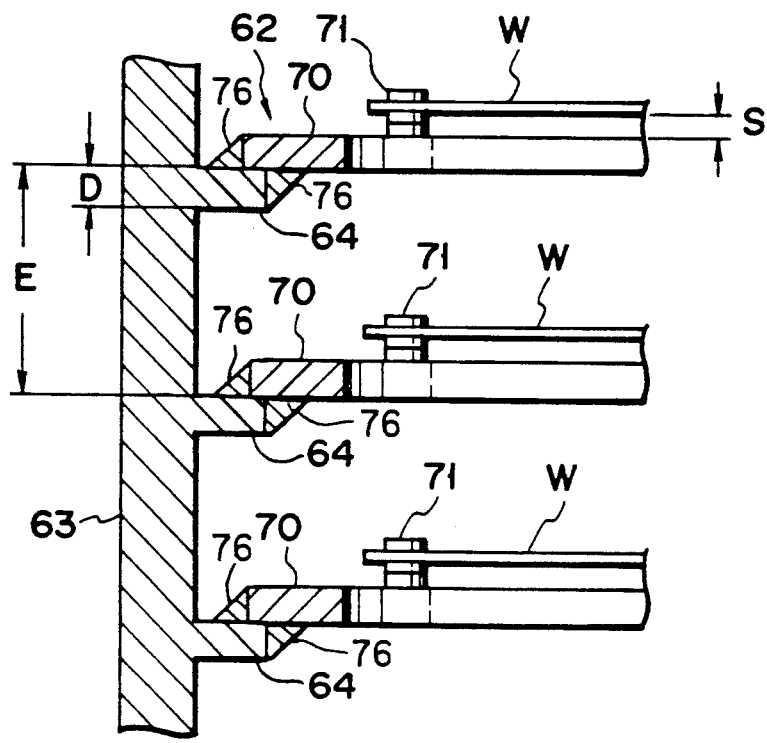
FIG. 8 is a partial enlarged sectional view showing a wafer supporting portion of the boat.

As shown in FIG. 8, the mounting height position of each supporting tongue 71b is adjusted so that the width of a space S between the lower surface of the wafer W and the upper surface of the ring member 70 ranges from about 3 to 10 mm. Preferably, the tongue 71b is mounted on the post 71a so that the space S is 5 mm wide. This is because the fork 37 of the wafer transfer device 30 is inserted into the space S. The respective widths of the spaces R and S between the ring member 70 and the wafer W are influenced by various conditions, including the flow rate of process gas kind of the gas, wafer diameter, etc., and their optimum values vary diversely.

The shape of the ring member 70 corresponds to that of the semiconductor wafer W, which has a diameter of 150 mm and in which the shortest distance from the center to the O.F. portion is 69 mm.

Figure 9:
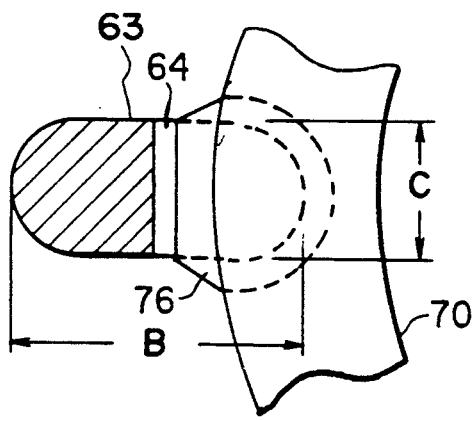
FIG. 9 is a cross-sectional top view showing a post and a tongue of the boat.

As shown in FIGS. 8 and 9, each main post 63 is formed by grinding a round quartz bar of 13-mm diameter into a rod with an elliptical cross section. Thus, the tongues 64 are formed by skiving. For example, the pitch E of the tongues 64 is 14.3 mm (9/16 inch), and the thickness D of each tongue 64 is 2.5 mm. The major axis length L and minor axis length C of the elliptical cross section of each main post 63 are 13 mm and 8 mm, respectively, for example. As shown in FIGS. 8 and 9, the ring member 70 is strongly fixed to the tongues 64 by a welding portion 76.

In the case of a quartz boat, if the minor axis length C of the main post 63 is shorter than 6 mm, the boat B lacks in strength, although the uniformity of wafer-surface film thickness is satisfactory, due to a minor disturbance of the process gas flow. If the length C exceeds 10 mm, on the other hand, the process gas flow suffers a considerable disturbance, so that the uniformity of wafer-surface film thickness lowers. Thus, in the case of the quartz boat B, the minor axis length C of the main post 63 preferably ranges from 6 to 10 mm. If silicon carbide (SiC) is used as the material of the main post 63, the length C can be reduced to about 4 mm.

If the pitch E of the tongues 64 is longer than 15 mm, moreover, a number of semiconductor wafers W cannot be processed at a time, although the uniformity of wafer-surface film thickness can be further improved. If the pitch E is shorter than 9 mm, on the other hand, the uniformity of wafer-surface film thickness is low. Preferably, therefore, the pitch E of the tongues 64 ranges from 9 to 15 mm.

The thickness D of each tongue 64 should be minimized as long as it can ensure satisfactory strength. Preferably, it ranges from 2 to 5 mm.

Referring now to FIGS. 4 and 5 and FIGS. 11A to 11C, operation for transferring the wafers W from each cassette 4 to the boat B will be described.

The wafer transfer device 30 is moved up or down and turned so that the fork 37 faces the desired cassette 4 on the station 16. Then, the fork 37 is advanced to be situated right under the desired wafer W in the cassette 4. The fork 37 is raised, and the wafer W is slightly lifted. Thereafter, the fork 37 is retreated, and one of the wafers W is taken out from the cassette 4.

Subsequently, the whole slider drive mechanism 32 is turned so that the wafer W on the fork 37 is opposed to boat B, as shown in FIG. 4. Then, the wafer transfer device 30 is moved up or down to situate the fork 37 at a desired height. The fork 37 is then advanced to be inserted between the wafer holders 62.

Figure 11A:
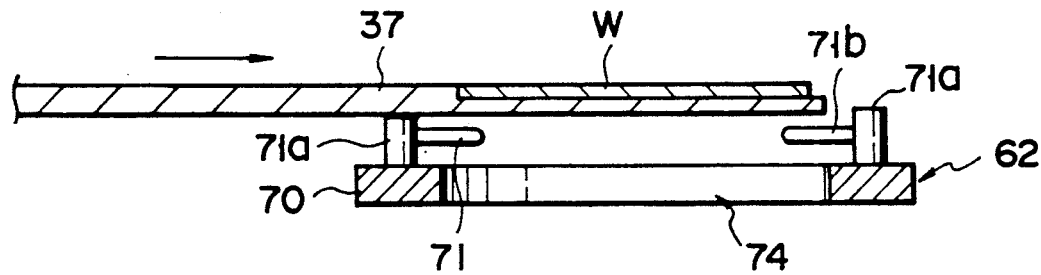
FIGS. 11A to 11C are vertical sectional side views showing a fork and the boat, for illustrating processes of loading the wafer into the boat.

As shown in FIG. 11A, the wafer W on the fork 37 is situated right over the ring member 70. This alignment may be executed using software means based on input information previously included in a program of the computer system 38, or hardware means based on position information for each supporting piece 71 detected by means of a sensor (not shown).

Figure 11B:
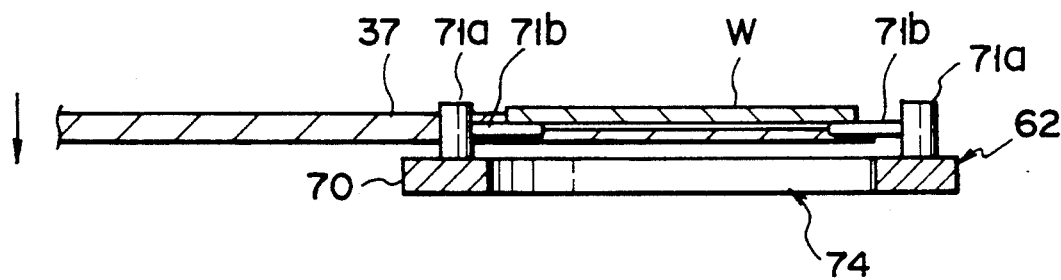

After the wafer W on the fork 37 is aligned with the boat B, the fork 37 is slightly lowered. By doing this, the wafer W is transferred from the fork 37 to the holder 62, as shown in FIG. 11B.

Figure 11C:
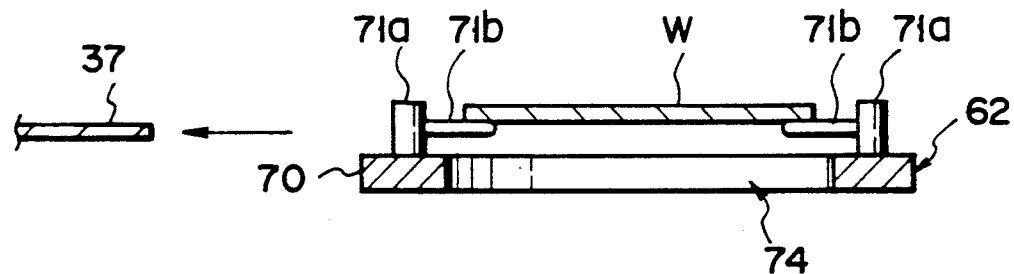

Then, the fork 37 is removed from the boat B, as shown in FIG. 11C. When the wafer W is thus held in the boat B, it is in contact with the four supporting plate members 71b only.

When loading fifty eight wafers W into the boat B is accomplished in this manner, the boat B is transported onto the heat insulating cylinder 56 by means of the boat transportation mechanism 40. Then, the boat B is raised by means of the loading-unloading mechanism 50, it is inserted into the process tube 24, and the bottom opening of the tube 24 is closed by means of the lid member 55.

Referring now to FIG. 3, processes of forming an oxide film on the surface of each wafer W will be described.

Electric power to be applied to each zone of the coil heater 22 is controlled so that the temperature of that region of the process tube 24 in which the loaded wafer W is situated is at a predetermined value. More specifically, the temperature is controlled so that the lower end portion and the central portion of the tube 24 are at 800° C., and the upper end portion is at 810° C. This temperature gradient with respect to the vertical direction is deliberately given because a large amount of heat radiates from the bottom opening of the process tube 24.

The process tube 24 is supplied, through the inlet 23, with 1,200 SCCM of nitrous oxide gas ($N_2O$), 30 SCCM of 100-vol % monosilane gas ($SiH_4$), along with a carrier gas (N₂ gas). The tube 24 is exhausted through the exhaust pipe 25 by adjusting an exhaust pump (not shown) and a conductance valve (not shown), whereby the internal pressure of the tube 24 is set at 0.8 Torr. In this state, the wafer W is filmed for a predetermined time.

FIG. 12 is a graph illustrating results obtained with use of the boat according to the present embodiment (black spots) compared with the conventional case or comparative example (circles). In FIG. 12, the axis of abscissa represents the standing (position) of the wafer W concerned in the boat B as reckoned from the top, and the axis of ordinate represents the uniformity of wafer-surface film thickness. In the comparative example, the wafer W is filmed by using a conventional boat whose posts are formed of round quartz bars of 13-mm diameter, and the other conditions ar identical with the ones used in the present embodiment.

According to the present embodiment, as seen from the graph of FIG. 12, the results of filming on 50 processed wafers W, out of the 58 wafers W including a dummy wafer, are satisfactory. More specifically, the deviation of wafer-surface film thickness is about ±1%.

According to the comparative example, in contrast with this, the deviation of wafer-surface film thickness ranges from 2 to 3%, so that the film thickness is subject to a substantial variation. In both the embodiment and the comparative example, top several wafers W are not uniform enough in surface film thickness.

The uniformity of wafer-surface film thickness is influenced by the positional relationships between the main posts 63 and the wafer W, and the amount of process gas supply is larger on the O.F. side where the distance between the adjacent main posts 63 is longer. On the O.F. side, therefore, the film thickness tends to be greater than in any other portions.

In the present embodiment, the O.F. portion of the wafer W is located on the side where the distance between the adjacent main posts 63 is wider, so that the uniformity of wafer-surface film thickness considerably varies depending on the presence or size of the straight portion 70a of the ring member 70. If no straight portion is formed on the ring member 70 of the same size, the width of the space R (space between the wafer W and the ring member 70) at the O.F. portion is as long as 12 mm. In parentheses, the space R is 2 mm wide throughout the circumference of the wafer W except the O.F. portion. If a holder in the form of an entire ring (with no straight portion) is used in the boat, the film thickness of the O.F. portion is greater than that of the remaining portion, so that the uniformity of wafer-surface film thickness is low.

If the ring member 70 is provided with the straight portion 70a, and if the regular space R of 2-mm width is defined along the whole circumference of the wafer W, the uniformity of wafer-surface film thickness is satisfactory. If the width of the space R between the ring member 70 and the wafer W is adjusted to 2 mm or less only at the O.F. portion, or if the member 70 and the wafer W are made to overlap each other (without the space R), the uniformity of wafer-surface film thickness is also satisfactory. The reason is that the process gas flow in the vicinity of the O.F. portion is cut off by the straight portion 70a, so that the gas supply is limited, and the film is restrained from growing at the O.F. portion. Thus, the film formed at the O.F. portion cannot be too thick, so that the film thickness is balanced throughout the wafer W. A secondary effect of the straight portion 70a on the ring member 70 is that the O.F. portion of the wafer W can be cooled more quickly.

If the O.F. portion of the wafer W is situated on the side where the distance between the posts 63 is shorter, and if the width of the space R between the ring member 70 and the wafer W is adjusted to 2 mm throughout the circumference, the film thickness tends to be greater on the side where the distance between the posts is wider, that is, on the side opposite to the O.F. portion. In this case, therefore, the desired uniformity of wafer-surface film thickness can be obtained by changing the shape of the ring member 70 so that the member 70 overlaps the wafer W at that portion opposite to the straight portion 70a.

The uniformity of wafer-surface film thickness is satisfactory if the outside diameter of the ring member 70 is 10 mm or more larger than the diameter of the wafer W. If the outside diameter of the member 70 is too large, however, the bore of the process tube 24 must be further increased. Inevitably, therefore, the apparatus is large-sized, so that the installation space is large, and the equipment cost is high. Thus, the outside diameter of the ring member 70 should preferably be 10 to 50 mm larger than the diameter of the wafer W. If the outer diameter of the ring member 70 is large, the uniformity of wafer-surface film thickness is good and D/R increases.

In order to ensure satisfactory uniformity of wafer-surface film thickness, the surface of the ring member 70 should be made smooth. It is ascertained that if the quartz glass surface of the member 70 is as rough as that of ground glass, the uniformity of wafer-surface film thickness is unsatisfactory, and good processing reproducibility cannot be obtained, despite the use of the same processing conditions of the embodiment described above.

Accordingly, it is necessary to subject the quartz surface of the ring member 70 to abrasive specular finishing of 10 μm or less or a process, so called bake finishing, for heating the surface for smoothness.

According to the present embodiment, as described above, the lowering of the uniformity of wafer-surface film thickness attributable to the main posts 63, as well as problems aroused by the O.F. portion of the semiconductor wafer W, can be prevented. Thus, the uniformity of wafer-surface film thickness can be considerably improved. When a semiconductor wafer 6-inch diameter was filmed, a deviation of film thickness to be obtained according to the present invention was about 1% as compared with 2% for the conventional case.

Figure 13:
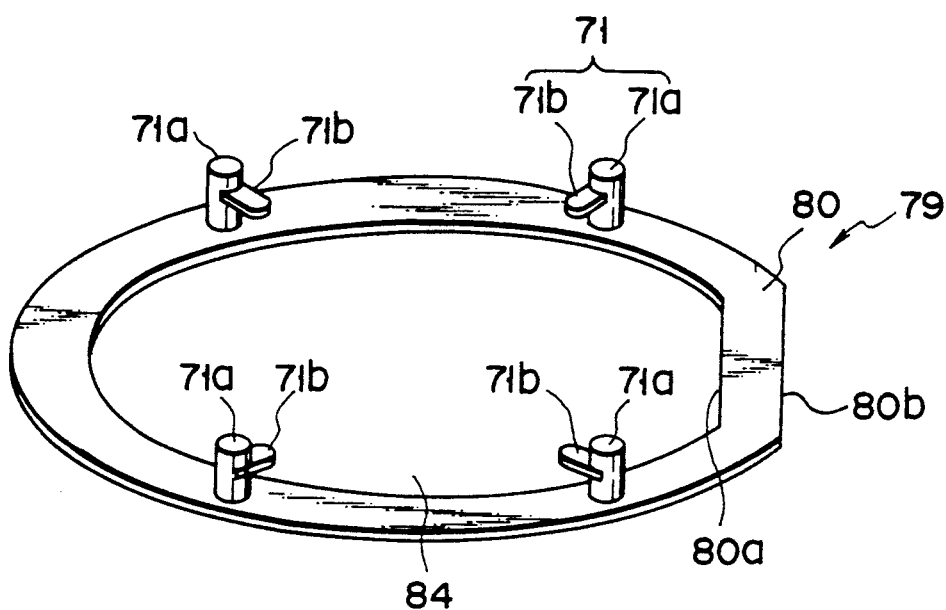
FIG. 13 is a perspective view showing a boat supporting member according to another embodiment of the present invention.

According to another embodiment of the present invention, as shown in FIG. 13, a ring member 80 having a special shape is used in a wafer holder 79 of the boat B. In this case, straight portion 80a and 80b are formed on the inner and outer peripherasies of the ring member 80, respectively, so that the member 80 resembles the wafer W in external shape as a whole.

With use of this wafer holder 79, a process gas flow around the wafer W in the boat B is even with respect to the wafer, so that the uniformity of wafer-surface film thickness can be further improved.

Figure 14:
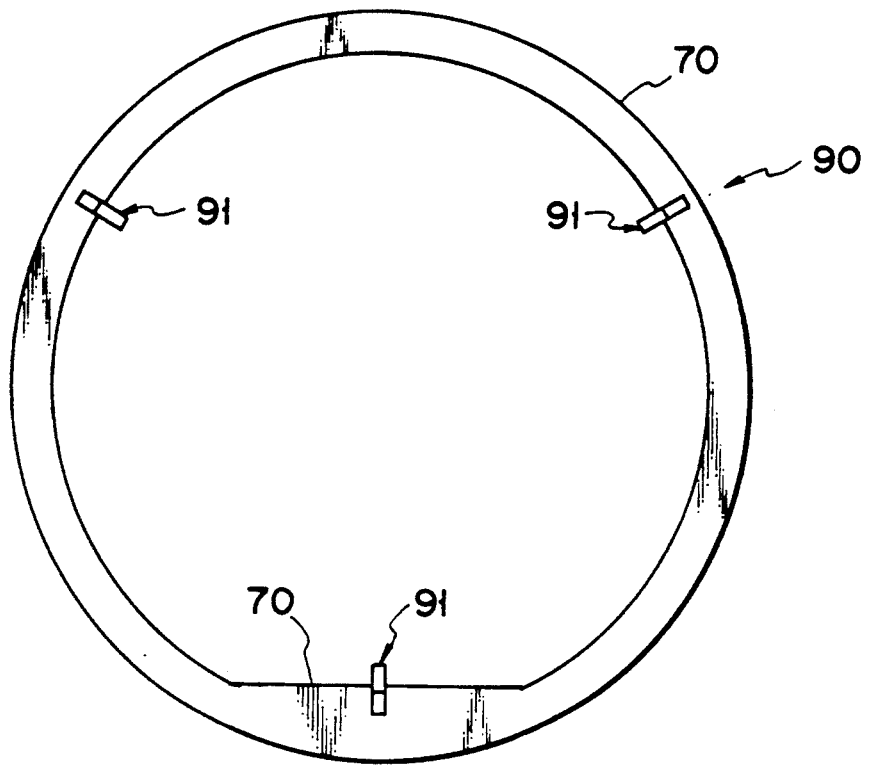
FIG. 14 is a plan view showing a boat supporting member according to still another embodiment.
Figure 15:
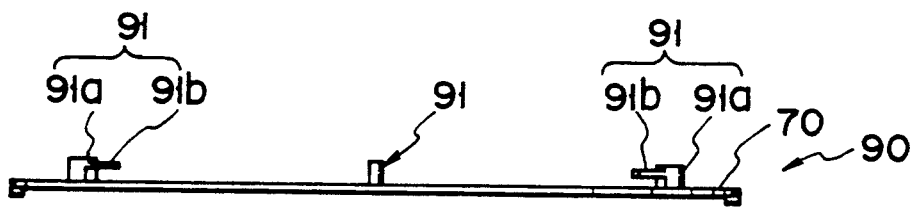
FIG. 15 is a side view showing a boat supporting member according to a further embodiment.

According to still another embodiment, as shown in FIGS. 14 and 15, a wafer holder 90 is formed of the ring member 70 of the first embodiment and three supporting pieces 91 mounted thereon. Each supporting piece 91 includes a loading portion 91b for carrying the wafer W thereon and a leg portion 91a supporting the portion 91b. The portions 91a and 91b are formed integrally with each other. In other words, each supporting piece 91 is an integral part skived out from a quartz block. Each supporting piece 91 is mounted by fitting the leg portion 91a into a hole in the ring member 70. Preferably, one of the supporting pieces 91 is mounted in the center of the straight portion 70a of the ring member 70.

With use of this wafer holder 90, the contact area between the wafer W an the boat B can be narrowed, so that the disturbance of the process gas flow around the wafer W can be further reduced, and the wafer W can be uniformly heated with higher efficiency.

It is to be understood that the present invention is not limited to the embodiments described above. A distinguished effect can be obtained if the invention is applied to CVD processes for producing a phosphorus-doped polysilicon film, boron-doped glass film, etc., for example. Further, the invention is not limited to gas-phase filming, and may be also applied to any other processes, such as oxide film forming, diffusion, etching, etc., in which a gas flow is used. The material of the boat B is not limited to quartz, and may be any other suitable material, such as SiC, $Al_2O_3$.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A heat treatment apparatus for transferring a semiconductor wafer between a cassette and a heat-resistant boat and for heat-treating a number of wafers loaded on the boat, comprising:

the boat having a wafer holding assembly for holding the wafer, a plurality of main posts, and a plurality of tongues equidistantly mounted to said main posts and projecting inward of the main posts;

said wafer holding assembly having a ring member fixed to said tongues and a plurality of supporting pieces mounted on an upper surface of said ring member such that wafers are brought into direct contact with said supporting pieces, an outer diameter of said ring member being larger than the wafer diameter;

wherein said ring member has a straight portion formed on an inner periphery thereof, and the straight portion corresponds to an orientation flat of the wafer, a major portion of a process gas flowing onto a wafer surface through the straight portion.

2. A heat treatment apparatus according to claim 1, wherein said ring member has another straight portion on the outer periphery thereof, the respective straight portions on the outer and inner peripheries extending parallel to each other.

3. A heat treatment apparatus for transferring a semiconductor wafer between a cassette and a heat-resistant boat and for heat-treating a number of wafers loaded on the boat, comprising:

gas supply means for supplying a process gas to a lower end side of the boat; and exhaust means for exhausting the process gas from an upper end side of the boat;

the boat having a wafer holding assembly for holding the wafer, a plurality of main posts, and a plurality of tongues equidistantly mounted to said main posts and projecting inward of the main posts;

said wafer holding assembly having a ring member fixed to said tongue and a plurality of supporting pieces mounted on the upper surface of said ring member such that wafers are brought into direct contact with said supporting pieces, the diameter of said ring member being larger than the wafer diameter; and a clearance being formed between the wafer supported by the supporting piece and the ring member such that a process gas passes through said clearance to flow in a vertical direction within the boat so as to be supplied onto the upper surface of the wafer.

4. A heat treatment apparatus according to claim 3, wherein the inside diameter of said ring member is larger than or equal to the diameter of the wafer.

5. A heat treatment apparatus according to claim 3, wherein an adjacent distance between said main posts on a wafer entering side is wider than that on the other side.

6. A heat treatment apparatus according to claim 5, wherein said ring member has a straight portion formed on the inner periphery thereof on the side where side adjacent distance between the posts is wider than that on the other side.

7. A heat treatment apparatus according to claim 5, wherein said main posts are provided with reinforcing ribs for reinforcing the main posts on the side where the distance between the main posts is narrower than that on the other side.

8. A heat treatment apparatus according to claim 3, further comprising projections arranged at regular intervals on each said main post and supporting said wafer holding assembly.

9. A heat treatment apparatus according to claim 3, wherein each said supporting piece is a combination of a columnar member projecting over the ring member and a plate member protruding inward from the columnar member toward an axis of the boat so as to extend beyond the inner peripheral of the ring member.

10. A heat treatment apparatus according to claim 3, wherein each said supporting piece includes a wafer loading portion and a leg portion for supporting the loading portion, said portions being formed integrally with each other.

11. A heat treatment apparatus according to claim 3, wherein said supporting pieces are arranged at regular intervals on the upper surface of the ring member.

12. A heat treatment apparatus according to claim 3, wherein said supporting pieces are three in number.

13. A heat treatment apparatus according to claim 3, wherein said supporting pieces are four in number.

14. A heat transfer apparatus according to claim 1, wherein said boat is formed of a material selected from the group consisting of quartz, SiC and $Al_2O_3$.

15. A heat treatment apparatus according to claim 3, wherein the upper surface of said ring member is finished by grinding or baking to have a smooth surface having a roughness not larger than 10 $\mu$m.

16. A heat treatment apparatus according to claim 3, wherein each of said ring member and said tongue is made of quartz, and the ring member is fixed to the tongue by welding.

17. A heat treatment apparatus according to claim 3, wherein the distance K between the two main posts at the ends of the semi-circular configuration formed by the arrangement of the main posts is larger than the diameter J of the wafer W.

* * * * *